(12) United States Patent
Morita et al.

(10) Patent No.: US 11,533,040 B2
(45) Date of Patent: Dec. 20, 2022

(54) ELASTIC WAVE DEVICE

(71) Applicant: Murata Manufacturing Co., Ltd., Nagaokakyo (JP)

(72) Inventors: Masayuki Morita, Nagaokakyo (JP); Hideki Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 1056 days.

(21) Appl. No.: 16/205,268

(22) Filed: Nov. 30, 2018

(65) Prior Publication Data
US 2019/0199320 A1 Jun. 27, 2019

(30) Foreign Application Priority Data
Dec. 25, 2017 (JP) .............. JP2017-248387

(51) Int. Cl.
*H03H 9/02* (2006.01)
*H03H 9/145* (2006.01)
*H03H 3/08* (2006.01)
*H03H 9/25* (2006.01)
*H03H 9/64* (2006.01)
*H01L 41/29* (2013.01)
*H01L 41/047* (2006.01)

(52) U.S. Cl.
CPC .......... *H03H 9/14541* (2013.01); *H03H 3/08* (2013.01); *H03H 9/02543* (2013.01); *H03H 9/02559* (2013.01); *H03H 9/02574* (2013.01); *H03H 9/02834* (2013.01); *H03H 9/02866* (2013.01); *H03H 9/14538* (2013.01); *H03H 9/25* (2013.01); *H03H 9/6489* (2013.01); *H01L 41/0477* (2013.01); *H01L 41/29* (2013.01)

(58) Field of Classification Search
CPC .......... H03H 9/14541; H03H 9/02543; H03H 9/02559; H03H 9/02834; H03H 9/02866
USPC ...... 310/313 R, 313 A, 313 B, 313 C, 313 D
See application file for complete search history.

(56) References Cited

U.S. PATENT DOCUMENTS

2004/0070313 A1* 4/2004 Furukawa .......... H03H 9/14541
310/313 R
2009/0121584 A1 5/2009 Nishimura et al.
(Continued)

FOREIGN PATENT DOCUMENTS

JP 2001-094383 A 4/2001
JP 2014-509134 A 4/2014
(Continued)

*Primary Examiner* — Derek J Rosenau
(74) *Attorney, Agent, or Firm* — Keating & Bennett, LLP

(57) ABSTRACT

An elastic wave device includes a piezoelectric film, a high acoustic velocity member, a low acoustic velocity film located between the piezoelectric film and the high acoustic velocity member and through which an elastic wave propagates at a lower acoustic velocity than an elastic wave that propagates through the piezoelectric film, and an interdigital transducer electrode including electrode fingers separated from each other and disposed side by side in a first direction. At least one of the electrode fingers includes a first metal layer including first and second main body portions. A recessed portion is located in a central region in the first direction of the electrode finger and is recessed in the thickness direction of the piezoelectric film. A protrusion portion protrudes from at least a portion of the first main body portion in the first direction.

17 Claims, 12 Drawing Sheets

(56) References Cited

U.S. PATENT DOCUMENTS

| | | |
|---|---|---|
| 2014/0035436 A1 | 2/2014 | Ruile et al. |
| 2014/0152146 A1* | 6/2014 | Kimura ............. H03H 9/02228 |
| | | 29/25.35 |
| 2017/0338796 A1 | 11/2017 | Morimoto et al. |
| 2018/0159497 A1 | 6/2018 | Iwamoto et al. |

FOREIGN PATENT DOCUMENTS

| | | |
|---|---|---|
| WO | 03/058813 A1 | 7/2003 |
| WO | 2007/034832 A1 | 3/2007 |
| WO | 2016/080444 A1 | 5/2016 |
| WO | 2017/043427 A1 | 3/2017 |

\* cited by examiner

ELASTIC WAVE DEVICE

CROSS REFERENCE TO RELATED APPLICATIONS

This application claims the benefit of priority to Japanese Patent Application No. 2017-248387 filed on Dec. 25, 2017. The entire contents of this application are hereby incorporated herein by reference.

BACKGROUND OF THE INVENTION

1. Field of the Invention

The present invention relates to an elastic wave device and, in particular, to an elastic wave device including a piezoelectric film and an interdigital transducer electrode.

2. Description of the Related Art

To date, elastic wave devices used as resonators, for band-pass filters, and the like have been known (refer to, for example, International Publication No. 2017/043427).

In an elastic wave device described in International Publication No. 2017/043427, a low acoustic velocity film, a piezoelectric film, and an interdigital transducer electrode are stacked in this order on a high acoustic velocity support substrate. The acoustic velocity of an elastic wave that propagates through the high acoustic velocity support substrate is higher than the acoustic velocity of an elastic wave that propagates through the piezoelectric film. The acoustic velocity of an elastic wave that propagates through the low acoustic velocity film is lower than the acoustic velocity of an elastic wave that propagates through the piezoelectric film.

However, the elastic wave device in the related art described in International Publication No. 2017/043427 has a problem in that the intensity in a higher-order mode in which the frequency is higher than the fundamental frequency is high.

SUMMARY OF THE INVENTION

Preferred embodiments of the present invention provide elastic wave devices in each of which the intensity in a higher-order mode in which the frequency is higher than the fundamental frequency is able to be reduced.

According to a preferred embodiment of the present invention, an elastic wave device includes a piezoelectric film, a high acoustic velocity member, a low acoustic velocity film, and an interdigital transducer electrode. The high acoustic velocity member is a member through which an elastic wave propagates at an acoustic velocity higher than the acoustic velocity of an elastic wave that propagates through the piezoelectric film. The low acoustic velocity film is a film which is disposed between the piezoelectric film and the high acoustic velocity member and through which an elastic wave propagates at an acoustic velocity lower than the acoustic velocity of an elastic wave that propagates through the piezoelectric film. The interdigital transducer electrode is disposed on the principal surface of the piezoelectric film. The interdigital transducer electrode includes a plurality of electrode fingers. The plurality of electrode fingers are separated from each other and disposed side by side in a first direction. At least one of the plurality of electrode fingers includes a first metal layer. The first metal layer includes a first main body portion and a second main body portion. The first main body portion is disposed directly or indirectly on the principal surface of the piezoelectric film. The second main body portion is disposed on the first main body portion. The second main body portion includes a recessed portion and a protrusion portion. The recessed portion is located in the central region in the first direction of the electrode finger and is recessed in the thickness direction of the piezoelectric film. The protrusion portion protrudes from at least a portion of the first main body portion in the first direction.

In elastic wave devices according to preferred embodiments of the present invention, the intensity in a higher-order mode in which the frequency is higher than the fundamental frequency is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
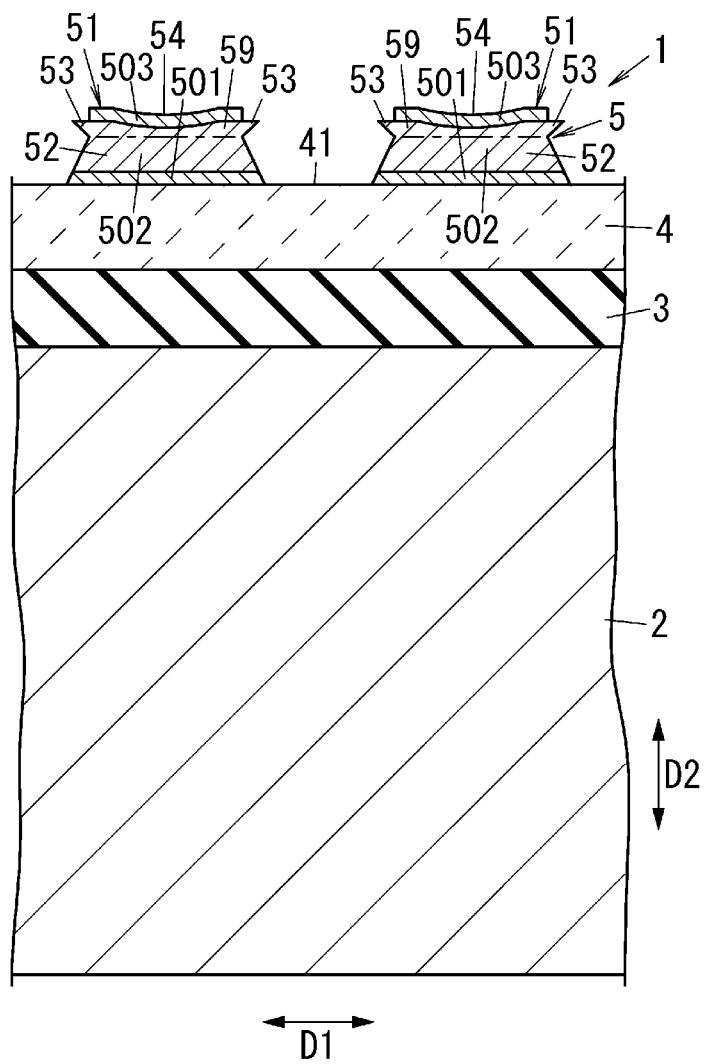
FIG. 1 is a sectional view of an elastic wave device according to a first preferred embodiment of the present invention.

Each of the preferred embodiments of the present invention relates to an elastic wave device, and more particularly, to an elastic wave device including a piezoelectric film and an interdigital transducer electrode.

The elastic wave devices according to the preferred embodiments will be described below with reference to the drawings.

FIG. 1, FIGS. 3A to 3H, FIG. 4 to FIG. 6, and FIG. 8 to FIG. 11 described in the preferred embodiments and modifications thereof are schematic diagrams, and the ratio of the sizes and the ratio of the thicknesses of elements in the drawings do not always reflect actual dimensional ratios.

First Preferred Embodiment

The overall configuration of an elastic wave device 1 according to the first preferred embodiment of the present invention will be described with reference to the drawings.

As shown in FIG. 1, the elastic wave device 1 according to the first preferred embodiment includes a high acoustic velocity support substrate 2, a low acoustic velocity film 3, a piezoelectric film 4, and an interdigital transducer (IDT) electrode 5. The low acoustic velocity film 3 is a film through which an elastic wave propagates at an acoustic velocity lower than the acoustic velocity of an elastic wave that propagates through the piezoelectric film 4. The interdigital transducer electrode 5 is disposed on the principal surface 41 of the piezoelectric film 4 and includes a plurality of electrode fingers 51. The plurality of electrode fingers 51 are separated from each other and disposed side by side in a first direction D1. The elastic wave device 1 according to the first preferred embodiment is preferably used as, for example, a resonator, or for a band-pass filter.

In such an elastic wave device 1, each of the plurality of electrode fingers 51 preferably includes a Ti layer 501, an AlCu layer 502, and a Ti layer 503, for example. The AlCu layer 502 includes a first main body portion 52 and a second main body portion 59. The first main body portion 52 is disposed directly or indirectly on the principal surface 41 of the piezoelectric film 4. The second main body portion 59 includes a recessed portion 54 and at least one protrusion portion 53. The protrusion portion 53 protrudes in the first direction D1.

Next, each element of the elastic wave device 1 according to the first preferred embodiment will be described with reference to the drawings.

The high acoustic velocity support substrate 2 is a substrate through which an elastic wave propagates at an acoustic velocity higher than the acoustic velocity of an elastic wave that propagates through the piezoelectric film 4. Here, the high acoustic velocity support substrate 2 defines a high acoustic velocity member.

The material for the high acoustic velocity support substrate 2 is preferably a piezoelectric material, for example, aluminum nitride, aluminum oxide, silicon carbide, silicon nitride, silicon, sapphire, lithium tantalate, lithium niobate, or quartz, a ceramic, for example, alumina, zirconia, cordierite, mullite, steatite, or forsterite, magnesia diamond, a material including the above-described materials as a primary component, or a material including a mixture of the above-described materials as a primary component.

The low acoustic velocity film 3 is a film through which an elastic wave propagates at an acoustic velocity lower than the acoustic velocity of an elastic wave that propagates through the piezoelectric film 4. The low acoustic velocity film 3 is disposed between the high acoustic velocity support substrate 2 and the piezoelectric film 4. Disposing the low acoustic velocity film 3 between the high acoustic velocity support substrate 2 and the piezoelectric film 4 decreases the acoustic velocity of an elastic wave. The energy of the elastic wave is essentially concentrated on a low acoustic velocity medium. Therefore, the energy of an elastic wave is confined to the piezoelectric film 4 and the interdigital transducer electrode 5 that excites the elastic wave is able to be improved. As a result, loss is able to be reduced and the Q-value is able to be increased compared with the case in which the low acoustic velocity film 3 is not disposed.

The material for the low acoustic velocity film 3 is preferably, for example, silicon oxide, glass, silicon oxynitride, tantalum oxide, a compound in which fluorine, carbon, or boron is added to silicon oxide, or a material including the above-described materials as a primary component.

When the material for the low acoustic velocity film 3 is silicon oxide, the temperature characteristics are able to be improved. The elastic constant of $LiTaO_3$ that is a material for the piezoelectric film 4 has negative temperature characteristics, and the elastic constant of silicon oxide has positive temperature characteristics. Therefore, regarding the elastic wave device 1, the absolute value of the temperature coefficients of frequency (TCF) is able to be reduced. Further, the specific acoustic impedance of silicon oxide is less than the specific acoustic impedance of $LiTaO_3$ that is a material for the piezoelectric film 4. Consequently, an increase in the electromechanical coupling coefficient, that is, an increased band width ratio, and an improvement in the temperature characteristics are able to be obtained.

The film thickness of the low acoustic velocity film 3 is preferably about $2.0\lambda$ or less, for example, where the wavelength of an elastic wave that is determined by the period of electrode fingers of the interdigital transducer electrode 5 is denoted as $\lambda$. The film stress is able to be reduced by setting the film thickness of the low acoustic velocity film 3 to be about $2.0\lambda$ or less, for example. As a result, warping of a wafer is able to be reduced, and an improvement in the non-defective rate and stabilization of the characteristics are able to be achieved. In this regard, when the film thickness of the low acoustic velocity film 3 is within the range of about $0.1\lambda$ or more and $0.5\lambda$ or less, for example, the electromechanical coupling coefficient hardly changes.

The piezoelectric film 4 is stacked directly or indirectly on the low acoustic velocity film 3. The material for the piezoelectric film 4 is preferably $LiTaO_3$, $LiNbO_3$, ZnO, AlN, or PZT, for example.

The film thickness of the piezoelectric film 4 in the thickness direction of the high acoustic velocity support substrate 2 (second direction D2) is preferably about $3.5\lambda$ or less, for example. When the film thickness of the piezoelectric film 4 is about $3.5\lambda$ or less, for example, the Q-value increases. When the film thickness of the piezoelectric film 4 is set to be about $2.5\lambda$ or less, for example, TCF is able to be decreased. When the film thickness of the piezoelectric film 4 is set to be about $1.5\lambda$ or less, for example, adjustment of the acoustic velocity of an elastic wave is facilitated.

The interdigital transducer electrode 5 includes a plurality of electrode fingers 51 and two busbars (not shown in the drawing) and is disposed on the principal surface 41 of the piezoelectric film 4. The plurality of electrode fingers 51 are disposed side by side in the first direction D1. The two busbars extend in a longitudinal direction, where the longitudinal direction is the first direction D1, and are electrically connected to the plurality of electrode fingers 51. In particular, the plurality of electrode fingers 51 include a plurality of first electrode fingers and a plurality of second electrode fingers. The plurality of first electrode fingers are electrically connected to a first busbar of the two busbars. The plurality of second electrode fingers are electrically connected to a second busbar of the two busbars.

The material for the plurality of electrode fingers 51 is preferably Al, Cu, Pt, Au, Ag, Ti, Ni, Cr, Mo, or W, or an appropriate metal material, such as an alloy primarily containing any one of these metals, for example. Alternatively, the plurality of electrode fingers 51 may have a structure in which a plurality of metal films made of these metals or alloys are stacked.

In the example shown in FIG. 1, each of the plurality of electrode fingers 51 preferably includes a Ti layer 501, an AlCu layer 502 (Al-based layer, metal layer), and a Ti layer 503, for example. The Ti layer 501, the AlCu layer 502, and the Ti layer 503 are stacked in this order. The Ti layer 501 has an excellent close contact property relative to the piezoelectric film 4 and, therefore, defines and functions as a close contact layer. Each of the film thickness of the Ti layer 501 and the thickness of the Ti layer 503 is preferably less than the film thickness of the AlCu layer 502. The close contact layer is not limited to the Ti layer 501 and may be a Cr layer or a NiCr layer, for example.

In the above-described interdigital transducer electrode 5, the AlCu layer 502 of each electrode finger 51 includes a first main body portion 52 and a second main body portion 59.

The first main body portion 52 is disposed indirectly on the principal surface 41 of the piezoelectric film 4 with the Ti layer 501 interposed therebetween. That is, the first main body portion 52 protrudes from the principal surface 41 of the piezoelectric film 4 with the Ti layer 501 interposed therebetween in the second direction D2 that is the thickness direction of the piezoelectric film 4.

The first main body portion 52 is tapered or substantially tapered. In particular, the first main body portion 52 is structured such that the width in the first direction D1 decreases from the base end at the location facing the piezoelectric film 4 in the second direction D2 toward the second main body portion 59 opposite to the base end in the second direction D2.

The second main body portion 59 is disposed on the first main body portion 52. That is, the second main body portion 59 is disposed opposite to the piezoelectric film 4 with the first main body portion 52 interposed therebetween in the second direction D2 (thickness direction of the piezoelectric film 4). The second main body portion 59 includes two protrusion portions 53.

The two protrusion portions 53 protrude in the first direction D1 from both ends of the portion on the first main body portion 52. In other words, each protrusion portion 53 protrudes from at least a portion of the first main body portion 52 in the first direction D1 in plan view in a third direction orthogonal or substantially orthogonal to the first direction D1 and the second direction D2. Each protrusion portion 53 is triangular or substantially triangular in plan view in the third direction.

The second main body portion 59 includes a recessed portion 54 that is located in a top end portion in the second direction D2 and in the central region in the first direction D1. In other words, the recessed portion 54 is located in a central region 56 at the location between the end regions 55 in the first direction D1 of the electrode finger 51. The central region 56 of the electrode finger 51 is a region interposed between the two end regions 55 of the electrode finger 51 in the first direction D1. The recessed portion 54 is recessed in the second direction D2.

Figure 2:
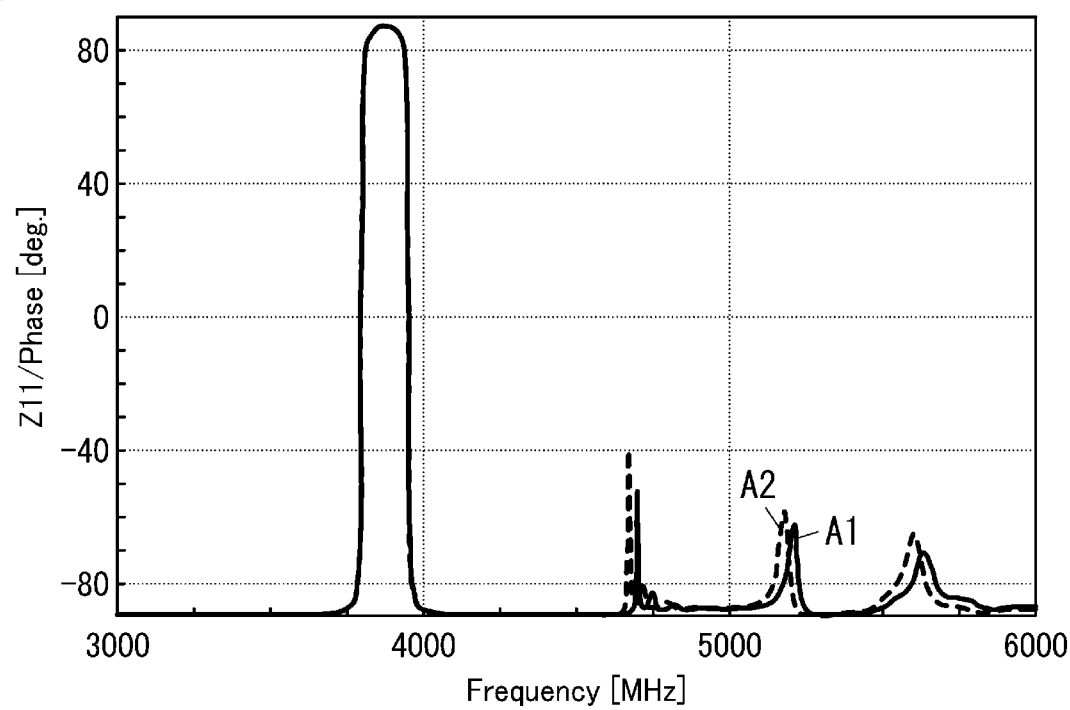
FIG. 2 is a frequency characteristic diagram of the elastic wave device in FIG. 1.

Next, frequency characteristics of the elastic wave device 1 according to the first preferred embodiment will be described with reference to FIG. 2. FIG. 2 shows frequency characteristics A1 of the elastic wave device 1 according to the first preferred embodiment and frequency characteristics A2 of an elastic wave device of a comparative example 1. The horizontal axis of FIG. 2 indicates the frequency and the vertical axis indicates the intensity. In the elastic wave device of the comparative example 1, none of the plurality of electrode fingers of the interdigital transducer electrode include a protrusion portion.

As indicated by the frequency characteristics shown in FIG. 2, the elastic wave device 1 according to the first preferred embodiment has lower intensity in the higher-order mode, in which the frequency is higher than the fundamental frequency, compared with the elastic wave device of the comparative example 1. That is, in the elastic wave device 1 according to the first preferred embodiment, each of the plurality of electrode fingers 51 of the interdigital transducer electrode 5 includes the protrusion portions 53 and, thus, the intensity in the higher-order mode is able to be reduced.

The mode of an elastic wave that propagates through the piezoelectric film 4 may be a longitudinal wave, a SH (shear horizontal) wave, or a SV (shear vertical) wave, or a mode combining these. The main mode used by the elastic wave device 1 according to the first preferred embodiment includes a SH (shear vertical) wave as a primary component. The higher-order mode refers to a spurious mode that occurs at a frequency higher than the main mode of an elastic wave that propagates through the piezoelectric film 4.

Next, a method for manufacturing the elastic wave device 1 according to the first preferred embodiment will be described with reference to FIGS. 3A to 3H. The elastic wave device 1 according to the first preferred embodiment is produced by a first step to an eleventh step.

In the first step, the high acoustic velocity support substrate 2 is prepared. In the second step, the low acoustic velocity film 3 is formed on the high acoustic velocity support substrate 2. In the third step, the piezoelectric film 4 is formed on the low acoustic velocity film 3.

Subsequently, the interdigital transducer electrode 5 is formed on the piezoelectric film 4 through by the fourth step to the eleventh step.

Figure 3A:
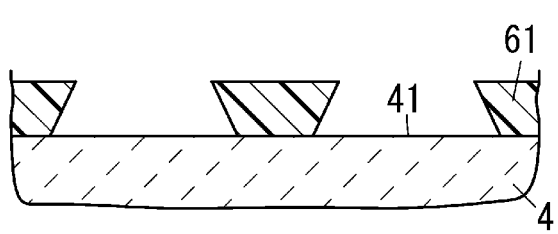
FIGS. 3A to 3H are sectional views illustrating the steps of manufacturing the elastic wave device in FIG. 1.

In the fourth step, as shown in FIG. 3A, a resist film 61 is formed on the principal surface of the piezoelectric film 4. In particular, the resist layer 61 is formed in a region other than a region in which the plurality of electrode fingers 51 of the interdigital transducer electrode 5 are to be disposed on the principal surface 41 of the piezoelectric film 4.

Figure 3E:
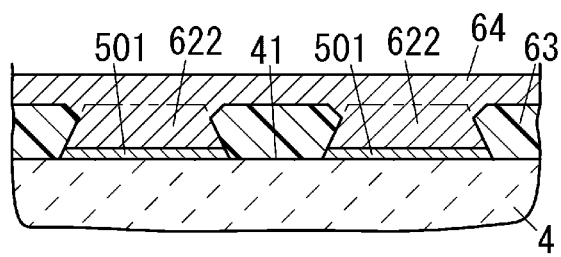
Figure 3B:
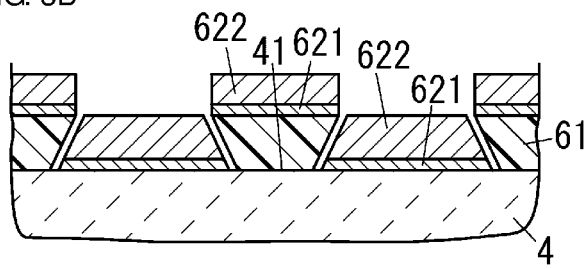

In the fifth step, as shown in FIG. 3B, a Ti film 621 defining and functioning as the Ti layer 501 is formed so as to cover the principal surface 41 of the piezoelectric film 4 and the resist layer 61. Further, an AlCu film 622 defining and functioning as the AlCu layer 502 is formed on the Ti film 621.

Figure 3F:
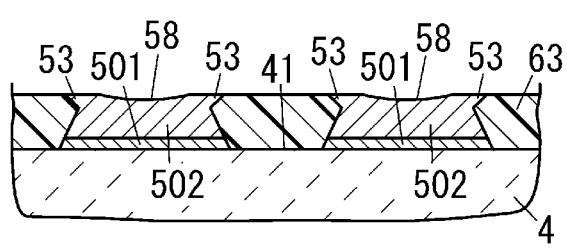
Figure 3C:
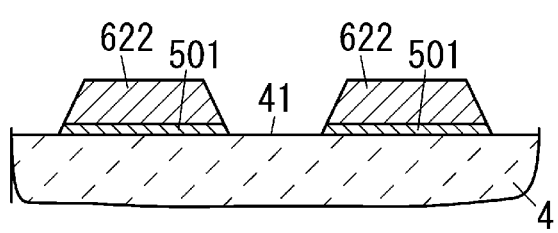

In the sixth step, as shown in FIG. 3C, the resist layer 61 is removed. The Ti film 621 and the AlCu film 622 formed on the resist layer 61 are also removed by removing the resist layer 61. Consequently, the Ti layer 501 and the AlCu layer 502 are formed.

Figure 3G:
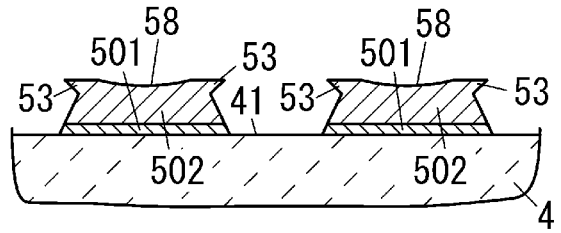
Figure 3D:
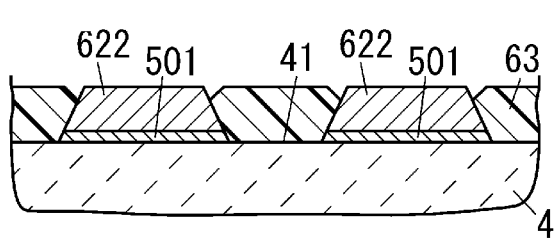

In the seventh step, as shown in FIG. 3D, a resist layer 63 is formed on the principal surface 41 of the piezoelectric film 4. In particular, the resist layer 63 is formed in a region in which the Ti layer 501 and the AlCu layer 502 are not formed on the principal surface 41 of the piezoelectric film 4. In this regard, the resist layer 63 is formed so as to cover the side surface of the Ti layer 501 and the side surface of the AlCu layer 502 excluding the top end area.

In the eighth step, as shown in FIG. 3E, an AlCu layer 64 defining and functioning as the protrusion portions 53 is formed so as to cover the AlCu layer 502 and the resist layer 63.

In the ninth step, a resist film is formed on the AlCu layer 64. At this time, the central portion of the AlCu layer 502 is not covered, and dry etching is performed. Subsequently, the resist film is peeled off. Then, etching is performed such that the upper surface of the resist layer 63 is exposed. Consequently, as shown in FIG. 3F, the protrusion portions 53 and a recessed portion 58 defining and functioning as the recessed portion 54 are formed.

Figure 3H:
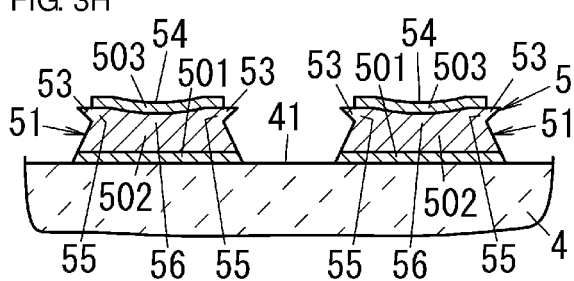

In the tenth step, as shown in FIG. 3G, the resist layer 63 is removed. In the eleventh step, as shown in FIG. 3H, the Ti layer 503 is formed on the AlCu layer 502.

As described above, regarding the elastic wave device 1 according to the first preferred embodiment, in a multilayer structure in which the low acoustic velocity film 3, the piezoelectric film 4, and the interdigital transducer electrode 5 are disposed in this order on the high acoustic velocity support substrate 2 (high acoustic velocity member), the recessed portion 54 is located in the central region in the first direction D1 of each of the plurality of electrode fingers 51 of the interdigital transducer electrode 5, and the protrusion portions 53 that protrude in the first direction D1 are provided. Consequently, the intensity in the higher-order mode in which the frequency is higher than the fundamental frequency is able to be reduced.

According to the elastic wave device 1 of the first preferred embodiment, the first main body portion 52 of each electrode finger 51 is tapered or substantially tapered and, thus, the intensity in the higher-order mode is able to be further reduced.

According to the elastic wave device 1 of the first preferred embodiment, an optimum combination for each electrode finger 51 is able to be selected compared with the case in which each electrode finger 51 includes only one layer.

According to the elastic wave device 1 of the first preferred embodiment, the Ti layer 501 has a higher close contact property with respect to the piezoelectric film 4 than the Al-based layer (AlCu layer 502), and the Ti layer 501 defines and functions as a bonding layer. Therefore, the bonding strength between the piezoelectric film 4 and the electrode finger 51 is able to be improved.

Modified examples of the first preferred embodiment will be described below.

Figure 4:
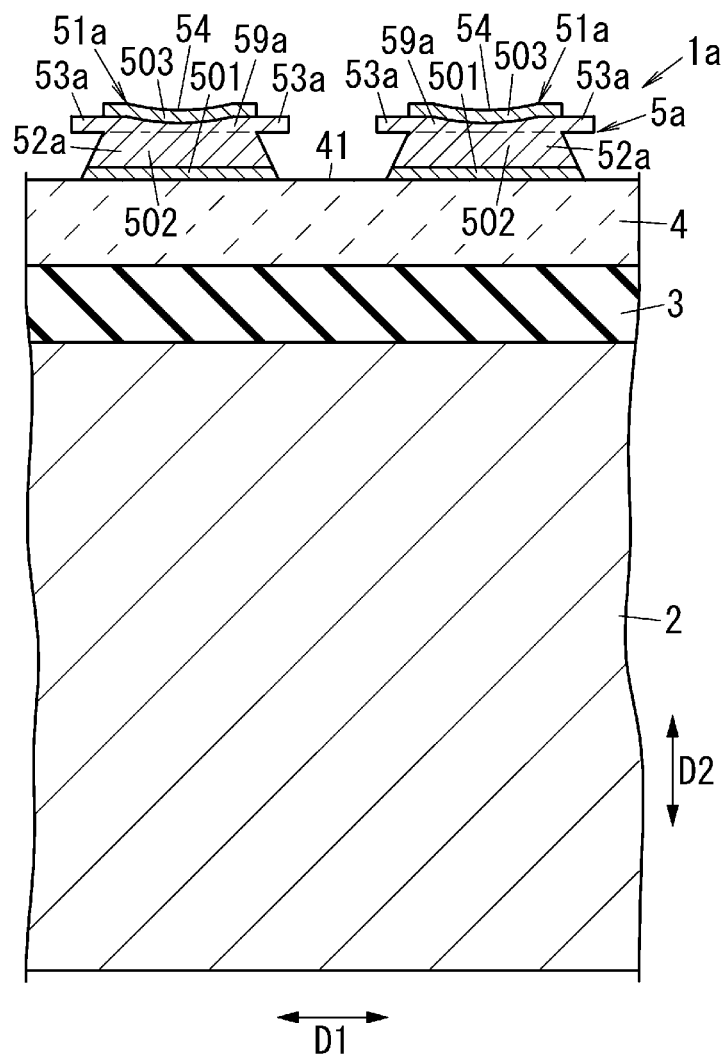
FIG. 4 is a sectional view of an elastic wave device according to a modified example 1 of the first preferred embodiment of the present invention.

Regarding a modified example 1 of the first preferred embodiment, protrusion portions 53a shown in FIG. 4 may be provided.

As shown in FIG. 4, an elastic wave device 1a includes an interdigital transducer electrode 5a, instead of the interdigital transducer electrode 5 (refer to FIG. 1). The interdigital transducer electrode 5a includes a plurality of electrode fingers 51a in the same or substantially the same manner as the interdigital transducer electrode 5 of the first preferred embodiment. In each of the plurality of electrode fingers 51a, the AlCu layer 502 includes a first main body portion 52a and a second main body portion 59a. The second main body portion 59a includes two protrusion portions 53a. The second main body portion 59a includes the recessed portion 54.

The two protrusion portions 53a protrude in the first direction D1 from both ends of the portion on the first main body portion 52a in the second main body portion 59a. Each protrusion portion 53a is tabular or substantially tabular in the first direction D1.

Figure 5:
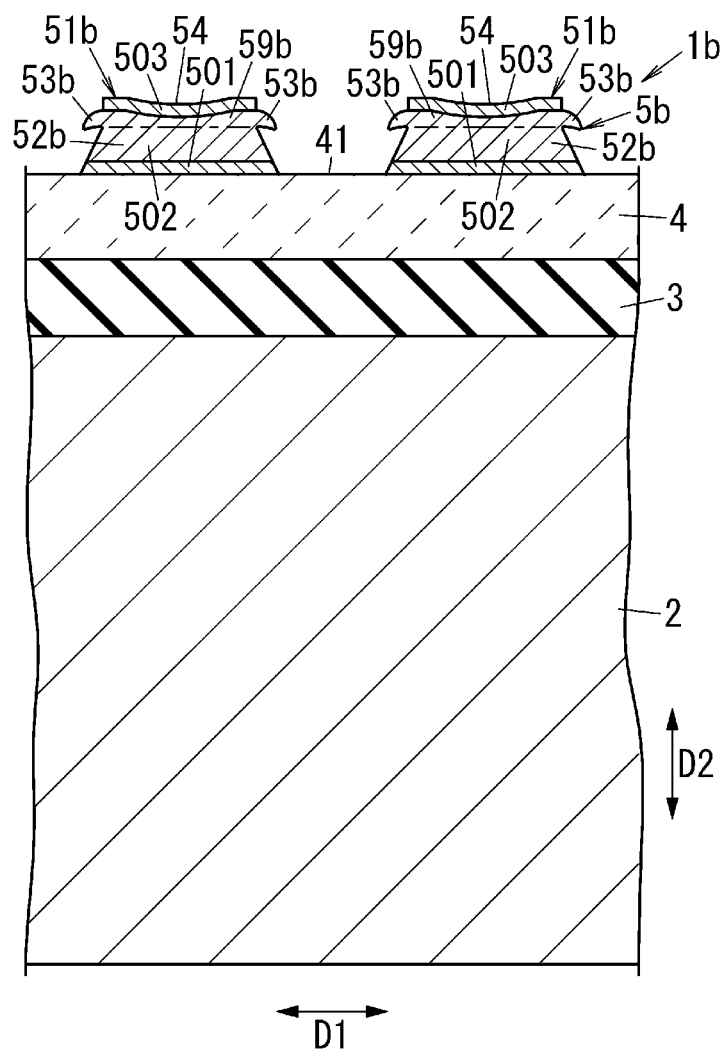
FIG. 5 is a sectional view of an elastic wave device according to a modified example 2 of the first preferred embodiment of the present invention.

Regarding a modified example 2 of the first preferred embodiment, protrusion portions 53b shown in FIG. 5 may be provided.

As shown in FIG. 5, an elastic wave device 1b includes an interdigital transducer electrode 5b, instead of the interdigital transducer electrode 5 (refer to FIG. 1). The interdigital transducer electrode 5b includes a plurality of electrode fingers 51b in the same or substantially the same manner as the interdigital transducer electrode 5 of the first preferred embodiment. In each of the plurality of electrode fingers 51b, the AlCu layer 502 includes a first main body portion 52b and a second main body portion 59b. The second main body portion 59b includes two protrusion portions 53b. The second main body portion 59b includes the recessed portion 54.

The two protrusion portions 53b protrude in the first direction D1 from both ends of the portion on the first main body portion 52b in the second main body portion 59b. Each protrusion portion 53b is structured so as not to protrude in the first direction D1 but to approach the piezoelectric film 4 with increasing proximity to the end in plan view in a third direction orthogonal or substantially orthogonal to the first direction D1 and the second direction D2.

Figure 6:
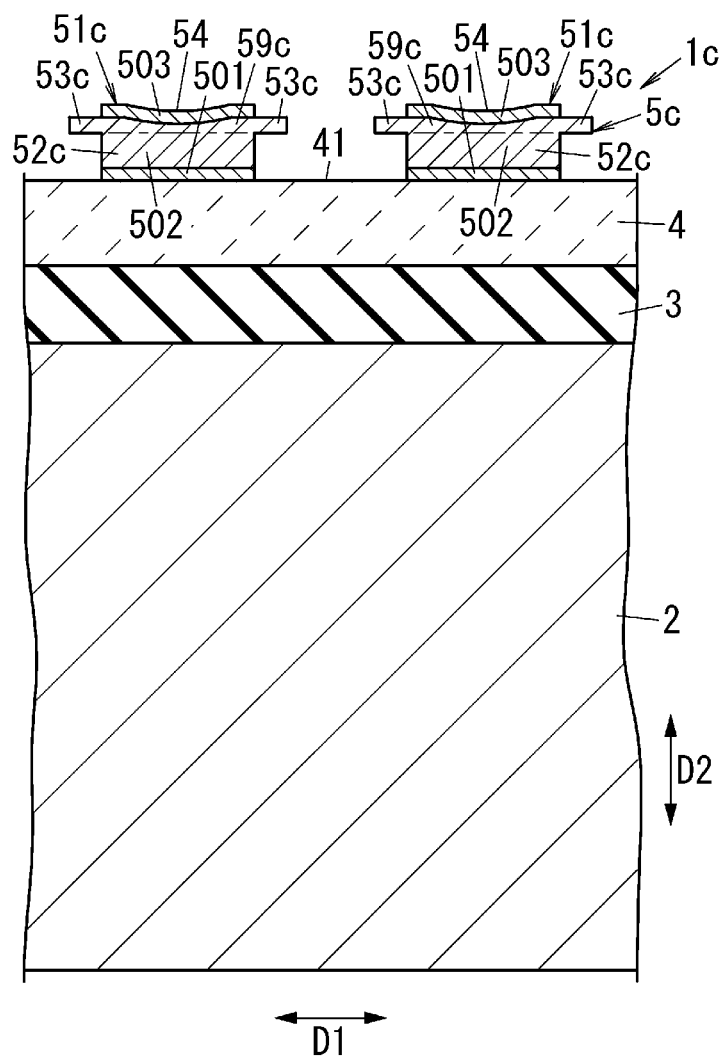
FIG. 6 is a sectional view of an elastic wave device according to a modified example 3 of the first preferred embodiment of the present invention.

Regarding a modified example 3 of the first preferred embodiment, an elastic wave device 1c may include an interdigital transducer electrode 5c shown in FIG. 6.

The interdigital transducer electrode 5c includes a plurality of electrode fingers 51c in the same or substantially the same manner as the interdigital transducer electrode 5 of the first preferred embodiment. In each of the plurality of electrode fingers 51c, the AlCu layer 502 includes a first main body portion 52c and a second main body portion 59c. The second main body portion 59c includes two protrusion portions 53c. The second main body portion 59c includes the recessed portion 54.

The first main body portion 52c is rectangular or substantially rectangular rather than tapered or substantially tapered. That is, the width of the base end and the width of the top end of the first main body portion 52c in the first direction D1 are the same or substantially the same. In this regard, "the width of the base end and the width of the top end of the first main body portion 52c in the first direction D1 are the same" is not limited to the width of the base end being exactly the same as the width of the top end, and the relationship in which the absolute value of the difference between the width of the base end and the width of the top end is within about 5%, for example, of the width of the base end is also included.

The two protrusion portions 53c protrude in the first direction D1. Each protrusion portion 53c is tabular or substantially tabular in the first direction D1 in the same or substantially the same manner as each protrusion portion 53a of the modified example 1.

Figure 7:
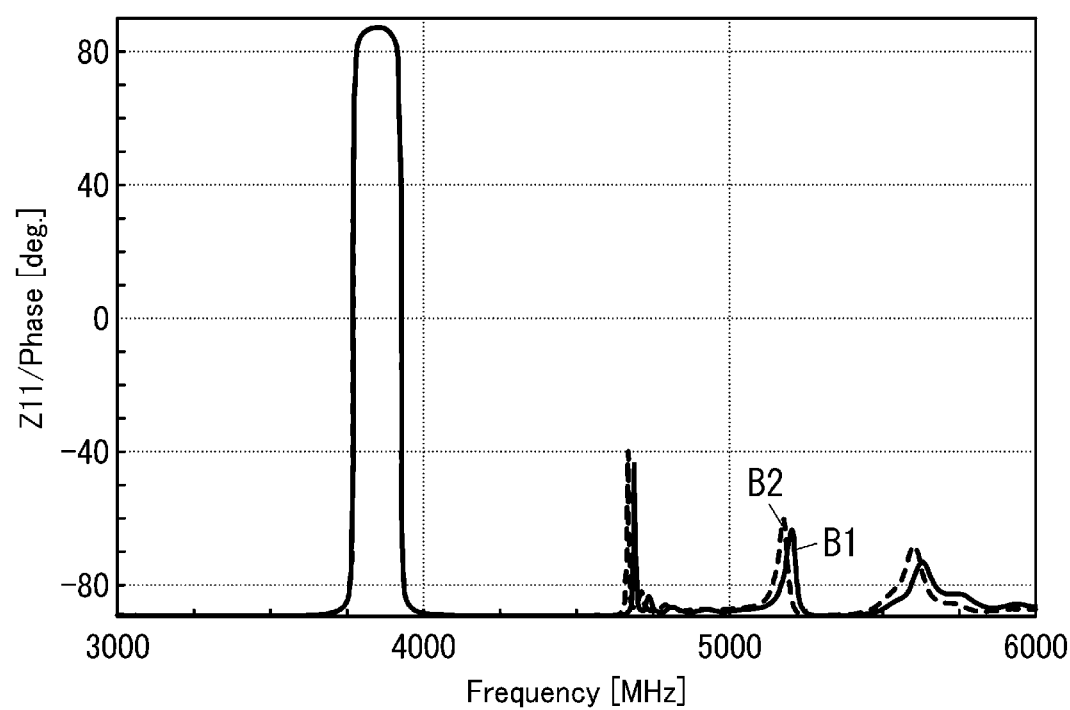
FIG. 7 is a frequency characteristic diagram of the elastic wave device in FIG. 1.

Frequency characteristics of the elastic wave device 1c according to the modified example 3 will be described with reference to FIG. 7. FIG. 7 shows frequency characteristics B1 of the elastic wave device 1c according to the modified example 3 and frequency characteristics B2 of an elastic wave device of a comparative example 2. In the elastic wave device of the comparative example 2, none of the plurality of electrode fingers of the interdigital transducer electrode include a protrusion portion.

As indicated by the frequency characteristics shown in FIG. 7, the elastic wave device 1c according to the modified example 3 has lower intensity in the higher-order mode than the elastic wave device of the comparative example 2. That is, in the elastic wave device 1c according to the modified example 3, each of the plurality of electrode fingers 51c of the interdigital transducer electrode 5c includes the protrusion portions 53c and, thus, the intensity in the higher-order mode is able to be reduced.

Each of the elastic wave devices 1a, 1b, and 1c according to the above-described respective modified examples provide the same or substantially the same advantageous effects as the elastic wave device 1 according to the first preferred embodiment.

Second Preferred Embodiment

Figure 8:
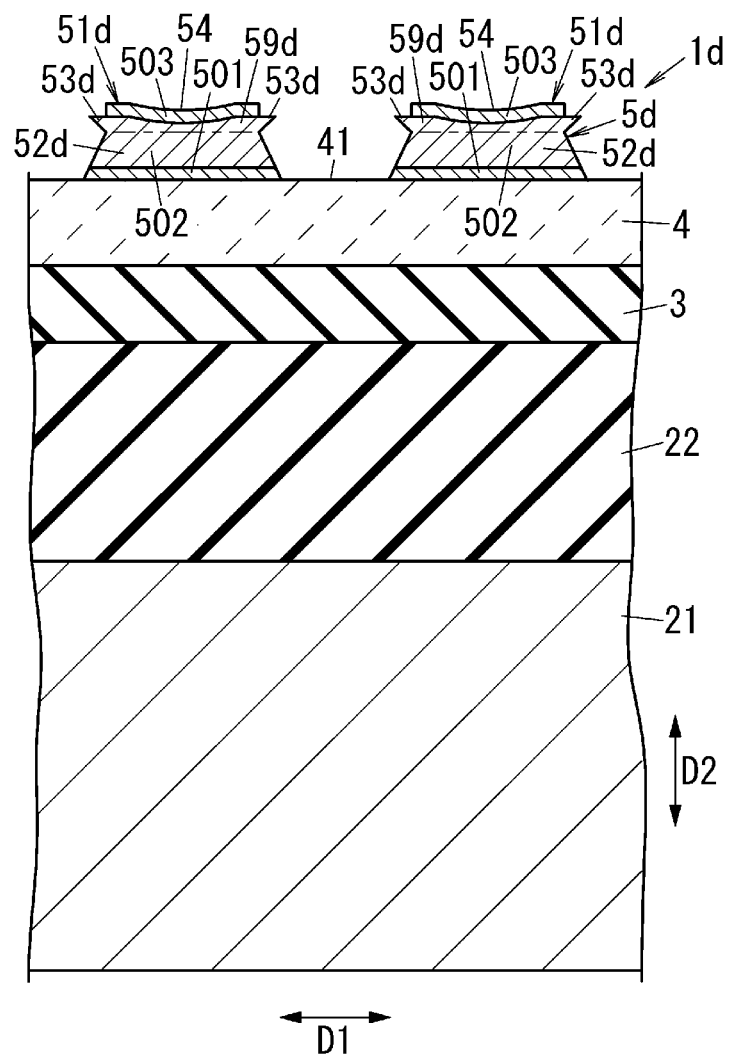
FIG. 8 is a sectional view of an elastic wave device according to a second preferred embodiment of the present invention.

An elastic wave device 1d shown in FIG. 8 according to a second preferred embodiment of the present invention is different from the elastic wave device 1 according to the first preferred embodiment (refer to FIG. 1) in that the configuration of the high acoustic velocity member is different. Regarding the elastic wave device 1d according to the second preferred embodiment, the same or similar elements as those in the elastic wave device 1 according to the first preferred embodiment are indicated by the same reference numerals as those set forth above and explanations thereof will not be provided.

The elastic wave device 1d includes a support substrate 21, a high acoustic velocity film 22, a low acoustic velocity film 3, a piezoelectric film 4, and an interdigital transducer electrode 5d. In the second preferred embodiment, the high acoustic velocity film 22 defines and functions as a high acoustic velocity member.

The elastic wave device 1d according to the second preferred embodiment is preferably used for, for example, a resonator or a band-pass filter, in the same or similar manner as the elastic wave device 1 according to the first preferred embodiment.

Next, each element of the elastic wave device 1d according to the second preferred embodiment will be described with reference to the drawings.

The material for the support substrate 21 is preferably a piezoelectric material, for example, sapphire, lithium tantalate, lithium niobate, or quartz, a ceramic, for example, alumina, magnesia, silicon nitride, aluminum nitride, silicon carbide, zirconia, cordierite, mullite, steatite, or forsterite, a dielectric, for example, glass, a semiconductor, for example, silicon or gallium nitride, a resin substrate, or other suitable material.

The high acoustic velocity film 22 is disposed on the support substrate 21. The high acoustic velocity film 22 is a film through which an elastic wave propagates at an acoustic velocity higher than the acoustic velocity of an elastic wave that propagates through the piezoelectric film 4. The high acoustic velocity film 22 confines the elastic wave to the portion in which the piezoelectric film 4 and the low acoustic velocity film 3 are stacked and to avoid leakage of the elastic wave to the structure (support substrate 21) under the high acoustic velocity film 22.

In this structure, the energy of the elastic wave in a specific mode used to obtain characteristics of a filter or a resonator is distributed to the entire or substantially the entire piezoelectric film 4 and low acoustic velocity film 3 and also distributed to a portion facing the low acoustic velocity film 3 of the high acoustic velocity film 22 while being not distributed to the support substrate 21. The mechanism to confine the elastic wave by the high acoustic velocity film 22 is the same or substantially the same as the mechanism in the case of a Love wave surface acoustic wave that is a non-leaking SH wave and is described in, for example, Ken-ya HASHIMOTO, "Danseihyoumenha debaisu shimyure-shon gijutu nyuumon (Introduction to surface acoustic wave device simulation technology)", REALIZE, p. 26-28. The above-described mechanism is different from the mechanism to confine an elastic wave by using a Bragg reflector including an acoustic multilayer film.

The material for the high acoustic velocity film 22 is preferably a diamond-like carbon (DLC) film, a piezoelectric material, for example, aluminum nitride, aluminum oxide, silicon carbide, silicon nitride, silicon, sapphire, lithium tantalate, lithium niobate, or quartz, a ceramic, for example, alumina, zirconia, cordierite, mullite, steatite, or forsterite, magnesia diamond, a material including the above-described material as a primary component, or a material including a mixture of the above-described materials as a primary component.

Regarding the film thickness of the high acoustic velocity film 22, it is preferable that the film thickness of the high acoustic velocity film 22 be increased because the high acoustic velocity film 22 confines an elastic wave to the piezoelectric film 4 and the low acoustic velocity film 3. The degree of energy concentration on a resonance point is about 100% by setting the film thickness of the high acoustic velocity film 22 to be about $0.3\lambda$ or more, for example. Further, the degree of energy concentration on an antiresonance point is also about 100% by setting the film thickness of the high acoustic velocity film 22 to be about $0.5\lambda$ or more, for example, and, therefore, improved device characteristics are able to be obtained.

The interdigital transducer electrode 5d includes a plurality of electrode fingers 51d and two busbars (not shown in the drawing) and is disposed on the principal surface 41 of the piezoelectric film 4 in the same or similar manner as the interdigital transducer electrode 5 of the first preferred embodiment (refer to FIG. 1). Regarding the interdigital transducer electrode 5d of the second preferred embodiment, explanations of the same or similar configurations and functions as those of the interdigital transducer electrode 5 of the first preferred embodiment will not be provided.

In the interdigital transducer electrode 5d, each of the plurality of electrode fingers 51d preferably includes, for example, a Ti layer 501, an AlCu layer 502 (Al-based layer, metal layer), and a Ti layer 503. The AlCu layer 502 includes a first main body portion 52d and a second main body portion 59d. The second main body portion 59d includes two protrusion portions 53d. The second main body portion 59d includes the recessed portion 54.

The two protrusion portions 53d protrude in the first direction D1 from both ends of the portion on the first main body portion 52d. Each protrusion portion 53d is preferably triangular or substantially triangular in plan view in a direction orthogonal or substantially orthogonal to the first direction D1 and the second direction D2.

In the elastic wave device 1d according to the second preferred embodiment described above, the protrusion portions 53d that protrude in the first direction D1 are also disposed in each of the plurality of electrode fingers 51d of the interdigital transducer electrode 5d. Consequently, regarding the elastic wave device 1d according to the second preferred embodiment, the intensity in the higher-order mode in which the frequency is higher than the fundamental frequency is also able to be reduced in the same or similar manner as the elastic wave device 1 according to the first preferred embodiment.

Modified examples of the second preferred embodiment will be described below.

Figure 9:
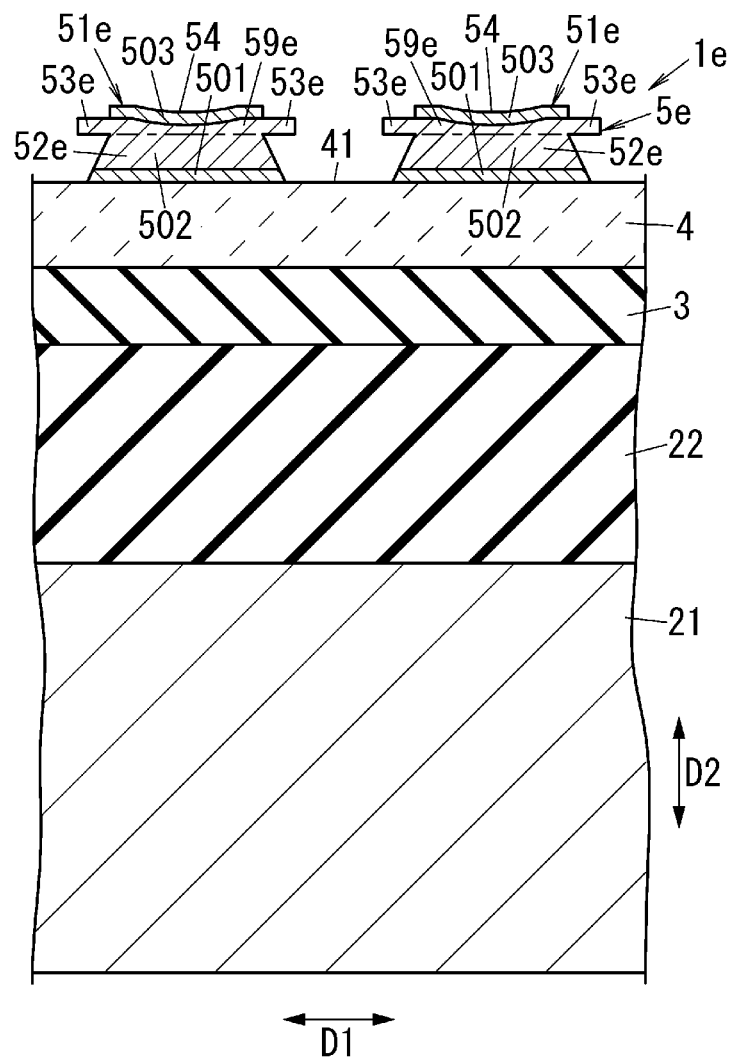
FIG. 9 is a sectional view of an elastic wave device according to a modified example 1 of the second preferred embodiment of the present invention.

Regarding a modified example 1 of the second preferred embodiment, protrusion portions 53e shown in FIG. 9 may be provided.

As shown in FIG. 9, an elastic wave device 1e includes an interdigital transducer electrode 5e, instead of the interdigital transducer electrode 5d (refer to FIG. 8). The interdigital transducer electrode 5e includes a plurality of electrode fingers 51e in the same or similar manner as the interdigital transducer electrode 5d of the second preferred embodiment. In each of the plurality of electrode fingers 51e, the AlCu layer 502 includes a first main body portion 52e and a second main body portion 59e. The second main body portion 59e includes two protrusion portions 53e. The second main body portion 59e includes the recessed portion 54.

The two protrusion portions 53e protrude in the first direction D1 from both ends of the portion on the first main body portion 52e in the second main body portion 59e. Each protrusion portion 53e is tabular or substantially tabular in the first direction D1.

Figure 10:
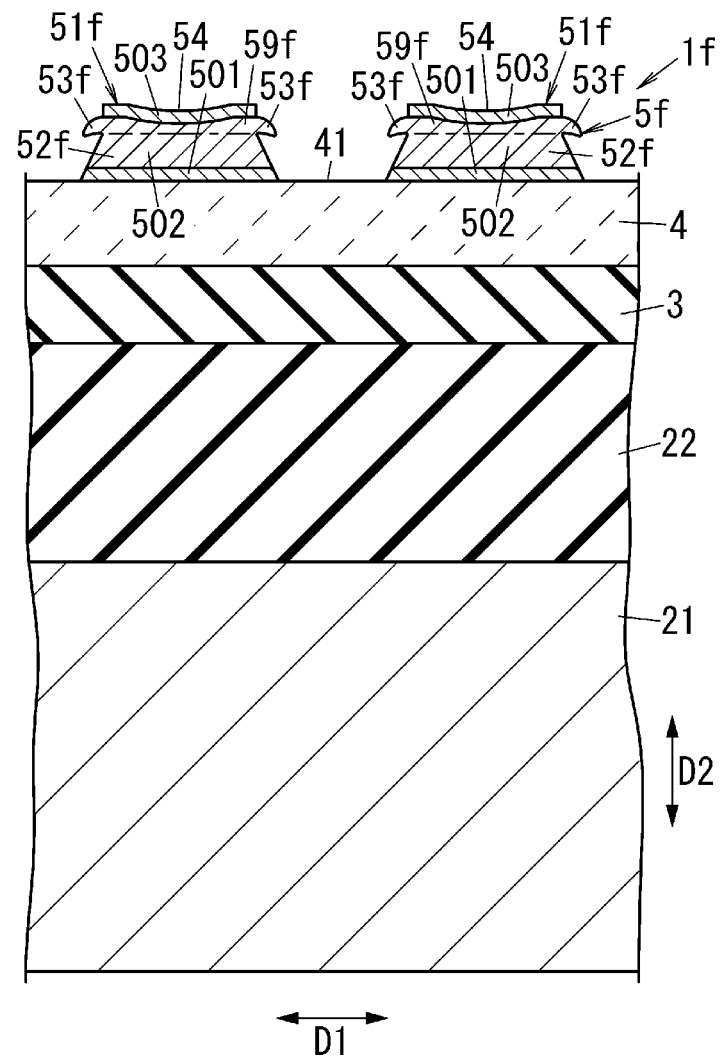
FIG. 10 is a sectional view of an elastic wave device according to a modified example 2 of the second preferred embodiment of the present invention.

Regarding a modified example 2 of the second preferred embodiment, protrusion portions 53f shown in FIG. 10 may be disposed.

As shown in FIG. 10, an elastic wave device 1f includes an interdigital transducer electrode 5f, instead of the interdigital transducer electrode 5d (refer to FIG. 8). The interdigital transducer electrode 5d includes a plurality of electrode fingers 51f in the same or similar manner as the interdigital transducer electrode 5 of the first preferred embodiment. In each of the plurality of electrode fingers 51f, the AlCu layer 502 includes a first main body portion 52f and a second main body portion 59f. The second main body portion 59f includes two protrusion portions 53f. The second main body portion 59f includes the recessed portion 54.

The two protrusion portions 53f protrude in the first direction D1 from both ends of the portion on the first main body portion 52f in the second main body portion 59f. Each protrusion portion 53f is structured so as not to protrude in the first direction D1 but to approach the piezoelectric film 4 with increasing proximity to the end in plan view in a third direction orthogonal or substantially orthogonal to the first direction D1 and the second direction D2.

Figure 11:
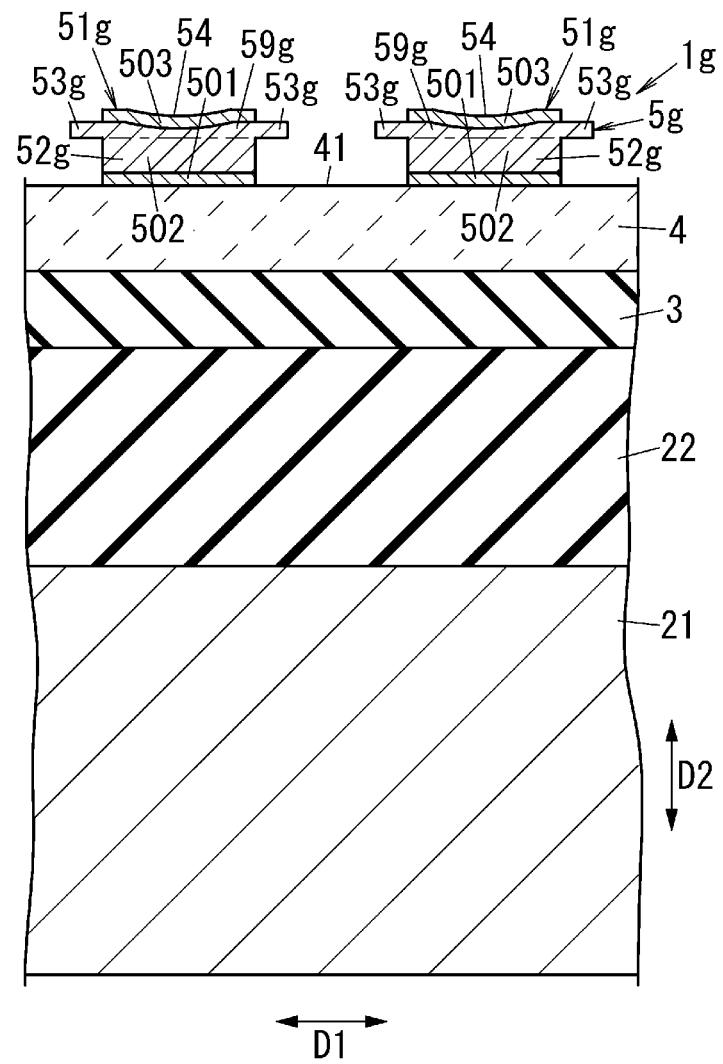
FIG. 11 is a sectional view of an elastic wave device according to a modified example 3 of the second preferred embodiment of the present invention.

Regarding a modified example 3 of the second preferred embodiment, an elastic wave device 1g may include an interdigital transducer electrode 5g shown in FIG. 11.

The interdigital transducer electrode 5g includes a plurality of electrode fingers 51g in the same or similar manner as the interdigital transducer electrode 5d of the second preferred embodiment. In each of the plurality of electrode fingers 51g, the AlCu layer 502 includes a first main body portion 52g and a second main body portion 59g. The second main body portion 59g includes two protrusion portions 53g. The second main body portion 59g includes the recessed portion 54.

The first main body portion 52g is rectangular or substantially rectangular rather than tapered or substantially tapered. That is, the width of the base end and the width of the top end of the first main body portion 52g in the first direction D1 are the same or substantially the same. In this regard, "the width of the base end and the width of the top end of the first main body portion 52g in the first direction D1 are the same" is not limited to the width of the base end being exactly the same as the width of the top end, and the relationship in which the absolute value of the difference between the width of the base end and the width of the top end is within about 5%, for example, of the width of the base end is also included.

The two protrusion portions 53g protrude in the first direction D1. Each protrusion portion 53g is tabular or substantially tabular in the first direction D1 in the same or similar manner as each protrusion portion 53e of the modified example 1.

Each of the elastic wave devices 1e, 1f, and 1g according to the above-described respective modified examples provides the same or substantially the same advantageous effects as the elastic wave device 1d according to the second preferred embodiment.

Figure 12:
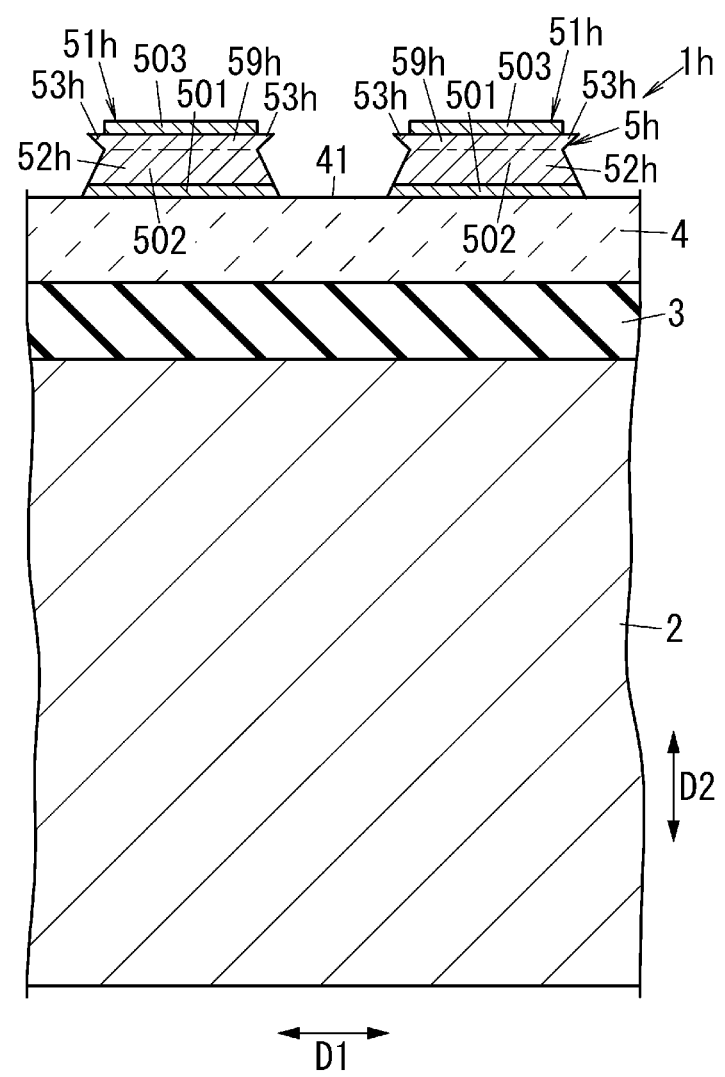
FIG. 12 is a sectional view of an elastic wave device according to a comparative example.

An elastic wave device 1h shown in FIG. 12 will be described as a comparative example. As shown in FIG. 12, the elastic wave device 1h is different from the elastic wave device 1 according to the first preferred embodiment (refer to FIG. 1) in that no recessed portion 54 is located in the central region of each of the plurality of electrode fingers 51h of the interdigital transducer electrode 5h. Regarding the elastic wave device 1h of the reference example, the same or similar elements as those in the elastic wave device 1 according to the first preferred embodiment are indicated by the same reference numerals as those set forth above and explanations thereof will not be provided.

The elastic wave device 1h includes a high acoustic velocity support substrate 2, a low acoustic velocity film 3, a piezoelectric film 4, and an interdigital transducer electrode 5h in the same or similar manner as the elastic wave device 1 according to the first preferred embodiment. The high acoustic velocity support substrate 2, the low acoustic velocity film 3, and the piezoelectric film 4 of the comparative example have the same or substantially the same functions as the high acoustic velocity support substrate 2, the low acoustic velocity film 3, and the piezoelectric film 4, respectively, of the first preferred embodiment. The elastic wave device 1h of the comparative example is also used for, for example, a resonator or a band filter in the same or similar manner as the elastic wave device 1 according to the first preferred embodiment.

The interdigital transducer electrode 5h includes a plurality of electrode fingers 51h and two busbars (not shown in the drawing) and is disposed on the principal surface 41 of the piezoelectric film 4.

The top end portion of each of the plurality of electrode fingers 51h in the second direction D2 is flat or substantially flat. That is, no recessed portion 54 (refer to FIG. 1) is located in the central portion of each electrode finger 51 in the first direction D1.

In the elastic wave device 1h, each protrusion portion 53h of the plurality of electrode fingers 51h of the interdigital transducer electrode 5h may be tabular or substantially tabular in the first direction D1. Each protrusion portion 53h has the same or substantially the same shape as the protrusion portion 53a of the modified example 1 according to the first preferred embodiment (refer to FIG. 4).

In the elastic wave device 1h, each protrusion portion 53h may be structured so as not to protrude in the first direction D1 but to approach the piezoelectric film 4 with increasing proximity to the end in plan view in a third direction orthogonal or substantially orthogonal to the first direction D1 and the second direction D2. Each protrusion portion 53h has the same or substantially the same shape as the protrusion portion 53b of the modified example 2 according to the first preferred embodiment (refer to FIG. 5).

The first main body portion 52h may be rectangular or substantially rectangular rather than tapered or substantially tapered. That is, the width of the base end and the width of the top end of the first main body portion 52h in the first direction D1 are the same or substantially the same. The first main body portion 52h has the same or substantially the same shape as the first main body portion 52c of the modified example 3 according to the first preferred embodiment (refer to FIG. 6). In this regard, "the width of the base end and the width of the top end of the first main body portion 52h in the first direction D1 are the same" is not limited to the width of the base end being exactly the same as the width of the top end, and the relationship in which the absolute value of the difference between the width of the base end and the width of the top end is within about 5%, for example, of the width of the base end is also included.

The elastic wave device 1h may include a support substrate and a high acoustic velocity film instead of the high acoustic velocity support substrate 2. The support substrate and the high acoustic velocity film are the same or substantially the same as, for example, the support substrate 21 and the high acoustic velocity film 22 according to the second preferred embodiment (refer to FIG. 8).

The above-described preferred embodiments and modified examples are merely examples of various preferred embodiments and modified examples according to the present invention. In addition, the preferred embodiments and the modified examples may be variously changed in accordance with the design as long as the advantageous effects of preferred embodiments of the present invention are able to be achieved.

According to the above-described preferred embodiments and modified examples, the following features are disclosed.

An elastic wave device (1; 1a to 1c; 1d; 1e to 1g) according to a preferred embodiment of the present invention includes the piezoelectric film (4), the high acoustic velocity member (high acoustic velocity support substrate 2; high acoustic velocity film 22), the low acoustic velocity film (3), and the interdigital transducer electrode (5; 5a to 5c; 5d; 5e to 5g). The high acoustic velocity member is a member through which an elastic wave propagates at an acoustic velocity higher than the acoustic velocity of an elastic wave that propagates through the piezoelectric film (4). The low acoustic velocity film (3) is a film which is disposed between the piezoelectric film (4) and the high acoustic velocity member and through which an elastic wave propagates at an acoustic velocity lower than the acoustic velocity of an elastic wave that propagates through the piezoelectric film (4). The interdigital transducer electrode (5; 5a to 5c; 5d; 5e to 5g) is disposed on the principal surface (41) of the piezoelectric film (4). The interdigital transducer electrode (5; 5a to 5c; 5d; 5e to 5g) includes a plurality of electrode fingers (51; 51a to 51c; 51d; 51e to 51g). The plurality of electrode fingers (51; 51a to 51c; 51d; 51e to 51g) are separated from each other and disposed side by side in a first direction (D1). At least one of the plurality of electrode fingers (51; 51a to 51c; 51d; 51e to 51g) includes a first metal layer (AlCu layer 502). The first metal layer (AlCu layer 502) includes the first main body portion (52; 52a to 52c; 52d; 52e to 52g) and the second main body portion (59; 59a to 59c; 59d; 59e to 59g). The first main body portion (52; 52a to 52c; 52d; 52e to 52g) is disposed directly or indirectly on the principal surface (41) of the piezoelectric film (4). The second main body portion (59; 59a to 59c; 59d; 59e to 59g) is disposed on the first main body portion (52; 52a to 52c; 52d; 52e to 52g). The second main body portion (59; 59a to 59c; 59d; 59e to 59g) includes the recessed portion (54) and the protrusion portion (53). The recessed portion (54) is located in the central region (56) in the first direction (D1) of the electrode finger and is recessed in the thickness direction (D2) of the piezoelectric film (4). The protrusion portions (53; 53a to 53c, 53d; 53e to 53g) protrude from at least a portion of the first main body portion (52; 52a to 52c; 52d; 52e to 52g) in the first direction (D1).

An elastic wave device (1; 1a to 1c; 1d; 1e to 1g) according to a preferred embodiment of the present invention has a multilayer structure in which the low acoustic velocity film (3), the piezoelectric film (4), and the interdigital transducer electrode (5; 5a to 5c; 5d; 5e to 5g) are disposed in this order on the high acoustic velocity member (high acoustic velocity support substrate 2; high acoustic velocity film 22). The recessed portion (54) is located in the central region (56) in the first direction (D1) of at least one of the plurality of electrode fingers (51; 51a to 51c; 51d; 51e to 51g) of the interdigital transducer electrode (5; 5a to 5c; 5d; 5e to 5g), and the protrusion portions (53; 53a to 53c, 53d; 53e to 53g) that protrude in the first direction (D1) are provided. Consequently, the intensity in the higher-order mode in which the frequency is higher than the fundamental frequency is able to be reduced.

In an elastic wave device (1; 1a; 1b; 1d; 1e; 1f) according to a preferred embodiment of the present invention, the first main body portion (52; 52a to 52c; 52d; 52e to 52g) is tapered or substantially tapered such that the width in the first direction (D1) decreases with increasing proximity to the second main body portion (59; 59a to 59c; 59d; 59e to 59g) from the base end facing the piezoelectric film (4) in the second direction D2.

In an elastic wave device (1; 1a; 1b; 1d; 1e; 1f) according to a preferred embodiment of the present invention, the first main body portion (52; 52a to 52c; 52d; 52e to 52g) of each electrode finger (51; 51a to 51c; 51d; 51e to 51g) is tapered or substantially tapered and, thus, the intensity in the higher-order mode is able to be further reduced.

In an elastic wave device (1; 1a to 1c; 1d; 1e to 1g) according to a preferred embodiment of the present invention, at least one of the plurality of electrode fingers (51; 51a to 51c; 51d; 51e to 51g) in the first or second aspect includes at least two layers including the first metal layer (AlCu layer 502).

With an elastic wave device (1; 1a to 1c; 1d; 1e to 1g) according to a preferred embodiment of the present invention, an optimum combination for each electrode finger (51; 51a to 51c; 51d; 51e to 51g) is able to be selected compared with the case in which each electrode finger (51; 51a to 51c; 51d; 51e to 51g) includes only one layer.

In an elastic wave device (1; 1a to 1c; 1d; 1e to 1g) according to a preferred embodiment of the present invention, at least one of the plurality of electrode fingers (51; 51a to 51c; 51d; 51e to 51g) further includes the close contact layer (Ti layer 501). The close contact layer is disposed on the principal surface (41) of the piezoelectric film (4). The first metal layer is the Al-based layer (AlCu layer 502) disposed opposite to the piezoelectric film (4) with the close contact layer interposed therebetween.

With an elastic wave device (1; 1a to 1c; 1d; 1e to 1g) according to a preferred embodiment of the present invention, the bonding strength between the piezoelectric film (4) and the electrode finger (51; 51a to 51c; 51d; 51e to 51g) is able to be improved.

In an elastic wave device (1; 1a to 1c; 1d; 1e to 1g) according to a preferred embodiment of the present invention, at least one of the plurality of electrode fingers (51; 51a to 51c; 51d; 51e to 51g) further includes the Ti layer (503). The Ti layer (503) is disposed on the Al-based layer (AlCu layer 502).

In an elastic wave device (1; 1a to 1c) according to a preferred embodiment of the present invention, the high acoustic velocity member includes the high acoustic velocity support substrate (2).

In an elastic wave device (1d; 1e to 1g) according to a preferred embodiment of the present invention, the support substrate (21) is further included. The high acoustic velocity member includes the high acoustic velocity film (22). The high acoustic velocity film (22) is disposed on the support substrate (21).

In an elastic wave device (1; 1a to 1c; 1d; 1e to 1g) according to a preferred embodiment of the present invention, the piezoelectric film (4) is made of $LiTaO_3$, $LiNbO_3$, ZnO, AlN, or PZT.

In an elastic wave device (1; 1a to 1c; 1d; 1e to 1g) according to a preferred embodiment of the present invention, the low acoustic velocity film (3) includes at least one material selected from a group consisting of silicon oxide, glass, silicon oxynitride, tantalum oxide, and a compound in which fluorine, carbon, or boron is added to silicon oxide.

In an elastic wave device (1; 1a to 1c) according to a preferred embodiment of the present invention, the high acoustic velocity support substrate (2) includes at least one material selected from a group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, and magnesia diamond.

In an elastic wave device (1d; 1e to 1g) according to a preferred embodiment of the present invention, the support substrate (21) includes at least one material selected from a group consisting of sapphire, lithium tantalate, lithium niobate, quartz, alumina, magnesia, silicon nitride, aluminum nitride, silicon carbide, zirconia, cordierite, mullite, steatite, forsterite, glass, silicon, gallium nitride, and resin.

In an elastic wave device (1d; 1e to 1g) according to a preferred embodiment of the present invention, the high acoustic velocity film (22) includes at least one material selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, and magnesia diamond.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric film;
    a high acoustic velocity member through which an elastic wave propagates at an acoustic velocity higher than an acoustic velocity of an elastic wave that propagates through the piezoelectric film;
    a low acoustic velocity film disposed between the piezoelectric film and the high acoustic velocity member and through which an elastic wave propagates at an acoustic velocity lower than the acoustic velocity of the elastic wave that propagates through the piezoelectric film; and
    an interdigital transducer electrode disposed on a principal surface of the piezoelectric film; wherein
    the interdigital transducer electrode includes a plurality of electrode fingers that are separated from each other and that are disposed side by side in a first direction;
    at least one of the plurality of electrode fingers includes a first metal layer;
    the first metal layer includes:
        a first main body portion disposed directly or indirectly on the principal surface of the piezoelectric film; and
        a second main body portion disposed on the first main body portion; and
    the second main body portion includes:
        a recessed portion located in a central region in the first direction of the at least one of the plurality of electrode fingers and that is recessed in a thickness direction of the piezoelectric film; and
        a protrusion portion that protrudes from at least a portion of the first main body portion in the first direction.

2. The elastic wave device according to claim 1, wherein the first main body portion is tapered such that a width of the first main body portion in the first direction decreases with increasing proximity to the second main body portion from a base end facing the piezoelectric film in the thickness direction of the piezoelectric film.

3. The elastic wave device according to claim 1, wherein the at least one of the plurality of electrode fingers includes at least two layers including the first metal layer.

4. The elastic wave device according to claim 3, wherein the at least one of the plurality of electrode fingers further includes:
    a close contact layer disposed on the principal surface of the piezoelectric film; and
    the first metal layer is an Al-based layer disposed opposite to the piezoelectric film with the close contact layer interposed therebetween.

5. The elastic wave device according to claim 4, wherein the at least one of the plurality of electrode fingers further includes a Ti layer disposed on the Al-based layer.

6. The elastic wave device according to claim 1, wherein the high acoustic velocity member includes a high acoustic velocity support substrate.

7. The elastic wave device according to claim 1, further comprising:
    a support substrate; wherein
    the high acoustic velocity member includes:
        a high acoustic velocity film disposed on the support substrate.

8. The elastic wave device according to claim 1, wherein the piezoelectric film is made of one of $LiTaO_3$, $LiNbO_3$, ZnO, AlN, or PZT.

9. The elastic wave device according to claim 1, wherein the low acoustic velocity film includes at least one material selected from a group consisting of silicon oxide, glass, silicon oxynitride, tantalum oxide, and a compound in which fluorine, carbon, or boron is added to silicon oxide.

10. The elastic wave device according to claim 6, wherein the high acoustic velocity support substrate includes at least one material selected from a group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, and magnesia diamond.

11. The elastic wave device according to claim 7, wherein the support substrate includes at least one material selected from a group consisting of sapphire, lithium tantalate, lithium niobate, quartz, alumina, magnesia, silicon nitride, aluminum nitride, silicon carbide, zirconia, cordierite, mullite, steatite, forsterite, glass, silicon, gallium nitride, and resin.

12. The elastic wave device according to claim 7, wherein the high acoustic velocity film includes at least one material selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, and magnesia diamond.

13. The elastic wave device according to claim 1, wherein the protrusion portion is triangular or substantially triangular.

14. The elastic wave device according to claim 1, wherein the protrusion portion is tabular or substantially tabular.

15. The elastic wave device according to claim 1, wherein a film thickness of the low acoustic velocity film is about $2.0\lambda$ or less, where $\lambda$ is a wavelength of an elastic wave propagating in the elastic wave device.

16. The elastic wave device according to claim 1, wherein a film thickness of the piezoelectric film is about $3.5\lambda$ or less, where $\lambda$ is a wavelength of an elastic wave propagating in the elastic wave device.

17. The elastic wave device according to claim 1, wherein the first main body portion is rectangular or substantially rectangular such that a width of a base end and a width of a top end of the first main body portion in the first direction are the same or substantially the same.

* * * * *